US007470473B2

(12) United States Patent
Eisler et al.

(10) Patent No.: US 7,470,473 B2
(45) Date of Patent: *Dec. 30, 2008

(54) NANOCRYSTAL STRUCTURES

(75) Inventors: Hans J. Eisler, Stoneham, MA (US);
Vikram C. Sundar, Stoneham, MA (US); Michael E. Walsh, Everett, MA (US); Victor I. Klimov, Los Alamos, NM (US); Moungi G. Bawendi, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,732

(22) Filed: Nov. 9, 2006

(65) Prior Publication Data

US 2007/0071062 A1 Mar. 29, 2007

Related U.S. Application Data

(62) Division of application No. 10/294,742, filed on Nov. 15, 2002, now Pat. No. 7,150,910.

(60) Provisional application No. 60/331,454, filed on Nov. 16, 2001.

(51) Int. Cl.
*B32B 9/00* (2006.01)

(52) U.S. Cl. ............... 428/701; 428/325; 372/39; 372/43.01

(58) Field of Classification Search .............. None
See application file for complete search history.

(56) References Cited

U.S. PATENT DOCUMENTS 5,260,957 A 11/1993 Hakimi et al.
5,262,357 A 11/1993 Alivisatos et al.
5,293,050 A 3/1994 Chapple-Sokol et al.
5,354,707 A 10/1994 Chapple-Sokol et al.
5,395,791 A 3/1995 Cheng et al.
5,422,489 A 6/1995 Bhargava
5,492,080 A 2/1996 Ohkawa et al.
5,499,260 A 3/1996 Takahashi et al.
5,505,928 A 4/1996 Alivisatos et al.

(Continued)

FOREIGN PATENT DOCUMENTS

JP 2000-155981 6/2000

(Continued)

OTHER PUBLICATIONS

Aktsipetrov, O.A., et al. "Generation of reflected second harmonic at semiconductor quantum dots," *JETP Letters*, vol. 55, No. 8, 435-439 (1992).

(Continued)

*Primary Examiner*—Timothy M Speer
(74) *Attorney, Agent, or Firm*—Steptoe & Johnson LLP

(57) ABSTRACT

A structure including a grating and a semiconductor nanocrystal layer on the grating, can be a laser. The semiconductor nanocrystal layer can include a plurality of semiconductor nanocrystals including a Group II-VI compound, the nanocrystals being distributed in a metal oxide matrix. The grating can have a periodicity from 200 nm to 500 nm.

6 Claims, 6 Drawing Sheets

U.S. PATENT DOCUMENTS

| | | | |
|---|---|---|---|
| 5,515,393 | A | 5/1996 | Okuyama et al. |
| 5,525,377 | A | 6/1996 | Gallagher et al. |
| 5,537,000 | A | 7/1996 | Alivisatos |
| 5,541,948 | A | 7/1996 | Krupke et al. |
| 5,559,057 | A | 9/1996 | Goldstein |
| 5,585,640 | A | 12/1996 | Huston et al. |
| 5,625,456 | A | 4/1997 | Lawandy |
| 5,670,279 | A | 9/1997 | Goldstein |
| 5,674,698 | A | 10/1997 | Zarling et al. |
| 5,747,180 | A | 5/1998 | Miller et al. |
| 5,751,018 | A | 5/1998 | Alivisatos et al. |
| 6,096,496 | A | 8/2000 | Frankel et al. |
| 6,207,229 | B1 | 3/2001 | Bawendi et al. |
| 6,251,303 | B1 | 6/2001 | Bawendi et al. |
| 6,337,117 | B1 | 1/2002 | Maenosono et al. |
| 6,506,342 | B1 | 1/2003 | Frankel |
| 6,611,640 | B2 | 8/2003 | LoCasclo et al. |
| 6,819,692 | B2 | 11/2004 | Klimov et al. |
| 7,150,910 | B2 * | 12/2006 | Eisler et al. ........... 428/325 |

FOREIGN PATENT DOCUMENTS

| | | |
|---|---|---|
| WO | WO 98/19963 | 5/1998 |
| WO | WO 99/19515 | 4/1999 |
| WO | WO 99/26299 | 6/1999 |
| WO | WO 99/50916 | 10/1999 |
| WO | WO 00/17655 | 3/2000 |
| WO | WO 00/17656 | 3/2000 |
| WO | WO 01/07689 | 2/2001 |
| WO | WO 01/71867 | 9/2001 |

OTHER PUBLICATIONS

Alivisatos, "Perspectives on the Physical Chemistry of Semiconductor nanocrystals", J. Phys. Chem., vol. 100, No. 31, pp. 13226-13239, (1996).

Alivisatos, "Semiconductor Clusters, Nanocrystals, and Quantum Dots," Science, 271, pp. 933-937, (1996).

Baltrameyunas, R., et al., "Fast switching of the transmission of light by glasses activated with CdS microcrystals," Sov. Phys. Semicond., vol. 25 No. 2, 164-166 (1991).

Baltramiejunas, R., et al. "Rapid Processes of Darkening and Bleaching in CdS Doped Glasses," Superlattices and Microstructures vol. 10, No. 3, 307-310 (1990).

Bawendi, et al,. "Luminescence properties of CdSe quantum crystallites: Resonance between interior and surface localized states", J. Chem. Phys., 96(2), pp. 946-954, (Jan. 1, 1992).

Bhargava, R.N., et al., "Quantum Confined Atoms of Doped ZnO Nanocrystals", Phys. Stat. Sol (b) 229, No. 2, 897-901 (2002).

Chamarro, M., et al., "Enhancement of electron-hole exchange interaction in CdSe nanocrystals; A quantum confinement effect," Physical Review B, vol. 53, No. 3, Jan. 15, 1996-I, 1336-1342.

Chamarro, M., et al., "Enhancement of Exciton Exchange Interaction by Quantum Confinement in CdSe Nanocrystals," Jpn. J. Appl. Phys, vol. 34, 12-14 (1994).

Chamarro, M., et al., "Size-dependent Electron-Hole Exchange Interaction in CdSe Quantum Dots, Il Nuovo Cimento," vol. 17, Nos. 11-12, (1995) 1407-1412.

Chepic, D.I., et al., "Auger ionization of semiconductor quantum drops in a glass matrix," Journal of Luminescence 47 (1990) 113-127 North-Holland.

Colvin et al., "Light-emitting diodes made from cadmium selenide nanocrystals and a semiconducting polymer" Nature, 370(6488):354-357, (Aug. 4, 1994).

Correa-Duarte et al., "Stabilization of CdS semiconductor nanoparticles against photodegradation by a silica coating procedure," Chemical Physics Letters, 286, pp. 497-501 (1998).

Dabbousi et al., "(CdSe)ZnS Core-Shell Quantum Dots: Synthesis and Characterization of a Size Series of Highly Luminescent Nanocrystallites," The Journal of Physical Chemistry B, 101(46), pp. 9463-9475 (1997).

Dabbousi et al., "Electroluminescence from CdSe quantum-dot/polymer composites," Appl. Phys. Lett., 66 (11), pp. 1316-1318, (1995).

Danek et al., "Synthesis of Luminescent Thin-film CdSeZnSe Quantum Dot Composites Using CdSe Quantum Dots Passivity with an Over layer of ZnS," Chem. Mater., 8(1), pp. 173-180, (1996).

Dneproviskii, V.S., et al., "Time-Resolved Luminescence of CdSe Microcrystals," Solid State Communications, vol. 74, No. 7, pp. 555-557, 1990.

Edamatsu, K., et al., "Subpicosecond dynamics of confined excitons and optical nonlinearities of CuCl quantum dots," Journal of Luminescence 66 & 67 (1996) 406-409.

Efros, A.L., et al., "Resonance Raman Spectroscopy of Electron-Hole Pairs—Polar Phonon Coupling in Semiconductor Quantum Microcrystals," Solid State Communications, vol. 78, No. 10, pp. 853-856, 1991.

Ekimov, A. I., et al., "Absorportion and intensity-dependent photoluminescence measurements on CdSe Quantum dots: assignment of the first electronic transitions," Journal of the Optical Society of America, vol. 10, Nos. 1-12, 100-107 (1992).

Ekimov, A., et al., "Growth of CdSe nanocrystals in ion-implanted $SiO_2$ films," Journal of Crystal Growth 151 (1995) 38-45.

Ekimov, A.I., "Growth and optical properties of semiconductor nanocrystals in a glass matrix," Journal of Luminescence 70 (1996) 1-20.

Ekimov, A.I., "Optical Properties of Oxide Glasses Doped by Semiconductor Nanocrystals," Radiation Effects and Defects in Solids, 1995, vol. 134, pp. 11-22.

Ekimov, A.I., "Optical Properties of Semiconductor Quantum Dots in Glass Matrix," Physica Scripta. vol. T39, 217-222 (1991).

Ekimov, A.I., et al. "Dimensional Effects in Luminescence Spectra of Zero-Dimensional Semiconductor Structures," Bulletin of the Russian Academy of Sciences, vol. 56, No. 2, pp. 154-157, Feb. 1992.

Ekimov, A.I., et al., "Spectra and Decay Kinetics of Radiative Recombination in CdS Microcrystals," Journal of Luminescence 46 (1990) 83-95 North-Holland.

Ekimov, A.I., et al., "Donor-like Exciton in Zero-Dimension Semiconductor Structures," Solid State Communications, vol. 69, No. 5, pp. 565-568, 1989.

Ekimov, A.I., et al., "Influence of high hydrostatic pressures on the exciton spectrum of CdS microcrystals in glass," Sov. Phys. Semicond. 23(9), Sep. 1989, pp. 965-966.

Ekimov, A.I., et al., "Nonlinear Optics of Semiconductor-Doped Glasses," Phys. Stat. Sol. (b) 150, (1988) pp. 627-633.

Ekimov, A.I., et al., "Optics of Zero Dimensional Semiconductor Systems, Acta Physica Polonica A," vol. 79 (1991), No. 1, pp. 5-14.

Ekimov, A.I., et al., "Photoluminescence of quasizero-dimensional semiconductor structures," Sov. Phys. Solid State 31(8), Aug. 1989, pp. 1385-1393.

Ekimov, A.I., et al., "Quantization of the energy spectrum of holes in the adiabatic potential of the electron," JETP Lett., vol. 43, No. 6, Mar. 25, 1986, pp. 376-379.

Ekimov, A.I., et al., "Quantum Size Effect in Semiconductor Microcrystals," Solid State Communications, vol. 56, No. 11, pp. 921-924, 1985.

Ekimov, A.I., et al., "Quantum size effect in the optical spectra of semiconductor microcrystals," Sov. Phys. Semicond. 16(7), Jul. 1982, pp. 775-778.

Ekimov, A.I., et al., "Quantum size effect in three-dimensional microscopic semiconductor crystals," JETP Lett, vol. 34, No. 6, Sep. 20, 1981, pp. 345-349.

Ekimov, A.I., et al., "Quantum-Size Stark Effect in Semiconductor Microcrystals," Journal of Luminescence 46 (1990) 97-100 North-Holland.

Ekimov, A.I., et al., "Size quantization of the electron energy spectrum in a microscopic semiconductor crystal," JETP Lett., vol. 40, No. 8, Oct. 25, 1984, pp. 1136-1139.

Empedocles, et al., "Photoluminescence Spectroscopy of Single CdSe Nanocrystallite Quantum Dots", Physical Review Letters, vol. 77, No. 18, pp. 3873-3876, (1996).

Empedocles, et al., Quantum-Confined Stark Effect in single CdSe Nanocrystallite Quantum Dots:, Sciente, vol. 278, pp. 2114-2117, (1997).

Farhoud, M. et al., *J. Vac. Sci. Technol.* B, 17, 3182-3185, (1999).

Gan, et al., "Enhanced Photoluminescence and Characterization of Mn-Doped ZnS Nanocrystallites Synthesized in Microemulsion", American Chemical Society, Langmuir, vol. 13, No. 24, pp. 6427-6431, (1997).

Gao et al., "Strongly Photoluminescent CdTe Nanocrystals by Proper Surface Modification," J. Phys. Chem., vol. 102, pp. 8360-8363, (1998).

Gindele, et al., "Optical gain and high quantum efficiency of matrix-free, closely packed CdSe quantum dots", Appl. Phys. Lett., 71(15), pp. 2181-2183, (Oct. 13, 1997).

Grabovskis, V.Y., et al., "Photoionization of semiconducting microcrystals in glass," *Sov. Phys. Solid State* 31(1), Jan. 1989, pp. 149-151.

Green, et al., "Recent advances in the preparation of semiconductors as isolated nanometric particles; new routes to quantum dots", Chem. Commun., pp. 2235-2241, (1999).

Guha et al., "Hybrid organic-inorganic semiconductor-based light-emitting diodes" J. Appl. Phys., 82(8), pp. 4126-4128,(Oct. 15, 1997).

Gurevich, S.A., et al. "Preparation and investigation of $SiO_2$ films activated by CdS semiconductor nanocrystals," *Soviet Physics Semiconductors*, vol. 26, 57-59 (1992).

Gurevich, S.A., et al., "Growth of CdS nanocrystals in silicate glasses and in thin $SiO_2$ films in the Initial states of the phase separation of a solid solution," *Semiconductors*, 28 (5), May 1994, 486-493.

Hines et al., "Synthesis and Characterization of Strongly Luminescing ZnS-Capped CdSe Nanocrystals," J. Phys. Chem. 100, pp. 468-471 (1996).

Itoh, T. et al., "Interface effects on the properties of confined excitons in CuCl microcrystals," *Journal of Luminescence* 60 & 61 (1994) 396-399.

Itoh, T., et al., "Polaron and Exciton-Phonon Complexes in CuCl Nanocrystals," *Physical Review Letters*, vol. 74, No. 9, Feb. 27, 1995, p. 1645-1648.

Itoh, T., et al., "Subpicosecond dynamics of confined excitons in CuCl nanocrystals," *Materials Science and Engineering* A217/218 (1996) 167-170.

Jarvis, Jr. et al., "Solution Synthesis and Photoluminescence Studies of SMA Crystallites of Cadmium Telluride," Mat. Res. Soc. Symp. Proc. 272, pp. 227-234 (1992).

Jursenas, S., et al., "Surface Recombination of Nonequilibrium Electron-Hole Plasma in Laser-Modified Semiconductor-Doped Glasses," *Solid State Communications*, vol. 87, No. 6, 577-580 (1993).

Kagan et al., "Electronic Energy Transfer in CdSe Quantum Dot Solids," Physical Review Letters, 76, pp. 1517-1520, (Feb. 26, 1996).

Kagan et al., "Long-range resonance transfer of electronic excitations in close-packed CdSe quantum-dot solids," Physical Review Letters, 54, pp. 8633-8643, (Sep. 15, 1996).

Klimov, et al., "Quantization of Multiparticle Auger Rates in Semiconductor Quantum Dots", Science, vol. 287, pp. 1011-1013, (Feb. 11, 2000).

Klimov, et al., "Ultrafast dynamics of inter- and intraband transitionsin semiconductor nanocrystals: Implications for quantum-dot lasers", Physical Review B, vol. 60, No. 4, pp. 2177-2180, (Jul. 15, 1999).

Kuno, et al., "The band edge luminescence of surface modified CdSe nanocrystallites: Probing the luminescing state", J. Chem. Phys. 106(23), pp. 9869-9882, (Jun. 15, 1997).

Leatherdale, et al., "Photoconductivity in CdSe quantum dot solids", vol. 62, No. 4, pp. 2669-2680, (Jul. 15, 2000).

Lee et al. "Full Color Emission from II-VI Semiconductor Quantum Dot-Polymer Composites," Adv. Mater. 12(15):1102-1105, 2000.

Lee et al., "Surface Derivatization of Nanocrystalline CdSe Semiconductors," Mat. Res. Soc. Symp. Proc. 452, pp. 323-328, (1997).

Lett, D. N., "Color-Coding Quantum Dots Debut With Promising Careers In Clinical Diagnostics Field", BioWorld Today, vol. 9, No. 185, p. 1, (1998).

Liz-Marzán, et al., "Synthesis of Nanosized Gold-Silica Core-Shell Particles," Langmuir 12, pp. 4329-4335, (1996).

Lublinskaya, O., et al., "CdS nanocrystal growth in thin silica films: evolution of size distribution function", *Journal of Crystal Growth* 184/185 (1998) 360-364.

Ludolph et at., "Novel single molecule precursor routes for the direct synthesis of highly monodispersed quantum dots of cadmium or zinc sulfide or selenide", Chem. Commun., pp. 1849-1850, (1998).

Malik, et al., "Semiconductor nanoparticles: their properties, synthesis and potential for application", South African Journal of Science, 96, pp. 55-60. (2000).

Michael, et al., "Randomly Ordered Addressable High-Density Optical Sensor Arrays", Analytical Chemistry, vol. 70, No. 7, pp. 1242-1248, (Apr. 7, 1998).

Mikulec et al., "Synthesis and Characterization of Highly Luminescent (CdSe)ZnS Quantum Dots," Materials Research Society Symposium, 452, pp. 359-364, (1997).

Müllenborn et al., "Characterization of Solution-Synthesized CdTe and HgTe," Applied Physics, 56, pp. 317-321, (1993).

Murray et al., "Synthesis and Characterization of Nearly Monodisperse CdE (E=S, Se, Te) Semiconductor Nanocrystallites", J. Am. Chem. Soc., vol. 115, No. 19, pp. 8706-8715, (1993).

Nirmal et al., "Fluorescence intermittency in single cadmium selenide nanocrystals", Nature, vol. 383, pp. 802-804, (Oct. 31, 1996).

Nozik et al., "Colloidal Quantum Dots of III-V Semiconductors," MRS Bulletin, 23(2), pp. 24-30 (1998).

Pehnt et al., "Nanoparticle Precursor Route to Low-Temperature Spray Deposition of CdTe Thin Films," Appl. Phys. Lett., 67(15), pp. 2176-2178, (Oct. 9, 1995).

Peng, et al., "Epitaxial Growth of Highly Luminescent CdSe/CdS Core/Shell Nanocrystals with Photostability and Electronic Accessibility," J. Am. Chem. Soc., 119, pp. 7019-7029, (1997).

Rogach et al., "Synthesis and characterization of Thiol-Stabilized CdTe Nanocrystals" Ber. Bunsenges. Phys. Chem., 100 (11), pp. 1772-2778, (1996).

Saviot, L., et al., "Effects of Resonance on Low-Frequency Raman Scattering From Semiconductor Nanocrystals," *Radiation Effects and Defects in Solids*, 1995, vol. 137, pp. 45-50.

Saviot, L., et al., "Size dependence of acoustic and optical vibrational modes of CdSe nanocrystals in glasses," *Journal of Non-Crystalline Solids* 197 (1996) 238-246.

Saviot, L., et al., "Size-selective resonant Raman scattering in CdS doped glasses," *Physical Review B*, vol. 57, No. 1, Jan. 1, 1998-I, 341-346.

Schattenburg, M.L. et al., J. Vac. Sci. Technol. B, 13, 3007-3011 (1995).

Sirenko, A.A., et al., "Spin-flip and acoustic-phonon Raman scattering in CdS nanocrystals", *Physical Review B*, vol. 58, No. 4, 15 (Jul. 1998-II), 2077-2087.

Spanhel et al., "Photochemistry of Colloidal Semiconductors. Surface Modification and Stability of Strong Luminescing CdS Particles", J. Am. Chem. Soc., 109 (19), pp. 5649-5655, (1987).

Tamulaitis, G., et al., "Dynamics of Nonlinear Optical Response of CuBr-Doped Glasses," *Superlattices and Microstructures*, vol. 3, No. 2, 199-202 (1993).

Valenta, J., et al., "Dynamics of excitons in CuBr nanocrystals: Sepctral-hole burning and transient four-wave-mixing measurements," *Physical Review B*, vol. 57, No. 3, Jan. 15, 1998-I, 1774-1783.

Vandyshev, Y.V., et al., "Nonlinear Optical properties of semiconductor microcrystals," *JETP Lett.*, vol. 46, No. 10, Nov. 25, 1987 pp. 435-439.

Volkov, A.S., et al., "Oscillations of polarization of recombination radiation of a variable gap semiconductor in a magnetic field," *JETP Lett.*, vol. 25 No. 55, 526-528 (1977).

\* cited by examiner

NANOCRYSTAL STRUCTURES

CLAIM OF PRIORITY

This application is a divisional of, and claims priority to, U.S. patent application Ser. No. 10/294,742, filed Nov. 15, 2002, and claims priority to U.S. Patent Application Ser. No. 60/331,454, filed on Nov. 16, 2001, each of which is hereby incorporated by reference.

FEDERALLY SPONSORED RESEARCH OR DEVELOPMENT

The U.S. Government may have certain rights in this invention pursuant to Grant No. DMR-98-08941 awarded by the National Science Foundation and Grant No. NSF-CHE-97-08265 awarded by the U.S. Department of Energy.

TECHNICAL FIELD

The present invention relates to structures and devices including a semiconductor nanocrystal.

BACKGROUND

Chemically synthesized colloidal semiconductor nanocrystals, also referred to as quantum dots, consist of 1-10 nm diameter inorganic semiconductor particles decorated with a layer of organic ligands. See, C. B. Murray et al., *Annu. Rev. Mat. Sci.*, 2000, 30, 545-610, which is incorporated in its entirety. These zero-dimensional semiconductor structures show strong quantum confinement effects that can be harnessed in designing bottom-up chemical approaches to create complex heterostructures with electronic and optical properties that are tunable with the size of the nanocrystals. At the same time, as a result of the surrounding organic ligand shell, semiconductor nanocrystals can be chemically manipulated as large molecules.

Optical amplifiers utilize a gain medium to amplify optical radiation. In an amplifier, a source excites the gain medium to produce a population inversion between high and low energy states of the gain medium. The excited gain medium can amplify optical radiation at energies overlapping the energy differences between the high and low energy states of the population inversion because stimulated emission of radiation from the medium is more efficient than absorption of light. In general, a laser utilizes a cavity to supply feedback to an excited gain medium to cause amplified spontaneous emission. A laser cavity can include a series of optical components, such as mirrors, arranged relative to the gain medium to reflect radiation back into the cavity and thereby provide feedback. For example, a gain medium can be placed into a stable or unstable resonator. Conventional solid-state and gas lasers and amplifiers generally provide very specific spectral outputs depending upon the laser material. If a spectral output other than that achievable with available gain materials or a less specific spectral output is desired, dye lasers or tunable optical parametric oscillators (OPO) or amplifiers (OPA) can be used. Dye lasers are large and bulky and also require fluid components that can be toxic.

SUMMARY

A structure includes a grating and a semiconductor nanocrystal layer. The semiconductor nanocrystal layer can include a plurality of nanocrystals incorporated in an inorganic matrix. The inorganic matrix can be a metal oxide matrix prepared, for example, by sol-gel processing, or other low temperature matrix-forming methods. The metal oxide matrix can be crystalline or non-crystalline. The metal oxide matrix can be free of light-scattering defects, such as, for example, cracks.

In one aspect, a structure includes grating having a periodicity from 200 nm to 500 nm and a semiconductor nanocrystal layer disposed on the grating.

In another aspect, a laser includes a grating and a semiconductor nanocrystal layer disposed on the grating, the layer including a plurality of semiconductor nanocrystals including a Group II-VI compound. The nanocrystals can be distributed in a metal oxide matrix.

In another aspect, a method of forming a laser includes selecting a semiconductor nanocrystal having a diameter and a composition and placing the semiconductor nanocrystal on a grating. The diameter of the nanocrystal can be selected to produce a laser having a particular output energy, the composition of the nanocrystal can be selected to produce a laser having a particular output energy, or the grating can be selected to have a periodicity selected to produce a laser having a particular output energy, or combinations thereof. A layer including the semiconductor nanocrystal can be formed on a surface of the grating.

Similar to previous efforts of incorporating nanocrystals into polymer matrices (see, J. W. Lee et al., *Advanced Materials* 2000, 12, 1102, incorporated by reference in its entirety), the synthesis of the nanocrystals and the preparation of the matrix are decoupled. Thus, narrow size distribution, high quality nanocrystals with high fluorescence efficiency are first prepared using previously established literature procedures and used as the building blocks. See, C. B. Murray et al., *J. Amer. Chem. Soc.* 1993, 115, 8706, B. O. Dabbousi et al., *J. Phys. Chem. B* 1997, 101, 9463, each of which is incorporated by reference in its entirety. The organic, surface-passivating ligands are then exchanged to stabilize the nanocrystals in polar solvents like ethanol, and also to provide a tether with which the nanocrystals are incorporated into the titania sol-gel matrix. Formation of a titania matrix using a titanium (IV) alkoxide precursor exposed controllably to moisture (see, A. Imhof et al., *Nature* 1997, 389, 948, incorporated by reference in its entirety) obviates the use of acid catalysts that are detrimental to the optical properties of the nanocrystals. Thermal annealing then completes the composite preparation. In this process, the gelation time under an inert atmosphere is critical, as incomplete incorporation of the nanocrystals leads to microscale phase separation of the nanocrystals from the titania matrix and the formation of optically scattering films.

In general, a semiconductor nanocrystal layer includes a plurality of semiconductor nanocrystals distributed in a metal oxide matrix. The semiconductor nanocrystal layer can be used to amplify optical radiation or produce optical radiation by lasing. In particular, the semiconductor nanocrystal layer includes concentrated solids of semiconductor nanocrystals, such as close-packed films of semiconductor nanocrystals, that provide high gain to produce optical amplification or lasing over short amplifier or cavity lengths.

A laser includes an semiconductor nanocrystal layer and a grating arranged relative to the semiconductor nanocrystal film to provide feedback. A laser can include a layer of a composition, the composition including a grating having a periodicity from 200 nm to 500 nm, from 250 nm to 450 nm, or from 300 nm to 400 nm, and a semiconductor nanocrystal layer disposed on the grating. A laser can include a layer of a composition, the composition including grating and semiconductor nanocrystal film on the grating, the film including a plurality of semiconductor nanocrystals distributed in a metal oxide matrix. The semiconductor nanocrystal layer can include a plurality of semiconductor nanocrystals distributed in a metal oxide matrix.

A method of amplifying an optical signal includes directing an optical beam into a composition including a grating and a semiconductor film having a plurality of semiconductor nanocrystals distribute in a metal oxide matrix.

A method of forming a laser includes arranging a cavity relative to a layer to provide feedback to the layer. The optical gain medium includes a plurality of semiconductor nanocrystals distributed in a metal oxide matrix.

The layer can be substantially free of defects, reducing losses, such as scatter. The layer can provide gain to an optical signal at an energy equal to or less than the maximum band gap emission of the nanocrystals. The layer also can be capable of providing gain at energies in which a concentrated solid is substantially free of absorption.

The layer can include greater than 0.2%, greater than 5%, greater than 10%, or greater than 15% by volume semiconductor nanocrystals. The each of the plurality of semiconductor nanocrystals can include a same or different first semiconductor material. The first semiconductor material can be a Group II-VI compound, a Group II-V compound, a Group III-VI compound, a Group III-V compound, a Group IV-VI compound, a Group I-III-VI compound, a Group II-IV-VI compound, or a Group II-IV-V compound, such as, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. Each first semiconductor material can be overcoated with a second semiconductor material, such as ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. Each first semiconductor film has a first band gap and each second semiconductor material has a second band gap that is larger than the first band gap. Each nanocrystal can have a diameter of less than about 10 nanometers. The plurality of nanocrystals can have a monodisperse distribution of sizes. The plurality of nanocrystals have a plurality of monodisperse distribution of sizes. The plurality of monodisperse distribution of sizes can provide gain over a broad range of energies or over a plurality of narrow ranges, e.g., a FWHM of gain less than 75 nm, in which the gain maxima occur at a separate energy such that at least some of the narrow ranges do not overlap in energy. The concentrated solid of nanocrystals is disposed on a substrate such as glass. The concentrated solid of nanocrystals has a thickness greater than about 0.2 microns.

The metal oxide matrix can include a titanium oxide, an aluminum oxide, a silicon oxide, a magnesium oxide, a boron oxide, a phosphorus oxide, a germanium oxide, an indium oxide, a tin oxide, a zirconium oxide, or mixtures thereof.

Stabilization of nanocrystals within a titania matrix in the composite at volume fractions high enough to observe amplified stimulated emission (ASE) can lead to advantages, such as the observation of ASE at room temperature to the creation of more complicated structures showing ASE at multiple wavelengths. Coupling such structures to suitable feedback will allow for the development of room temperature lasers that are tunable over a wide spectral window. These matrices may also be useful for other non-linear optical applications of nanocrystals, where high nanocrystal density and matrix stability are important.

Other features, objects, and advantages of the invention will be apparent from the description and drawings, and from the claims.

DETAILED DESCRIPTION

Figure 1:
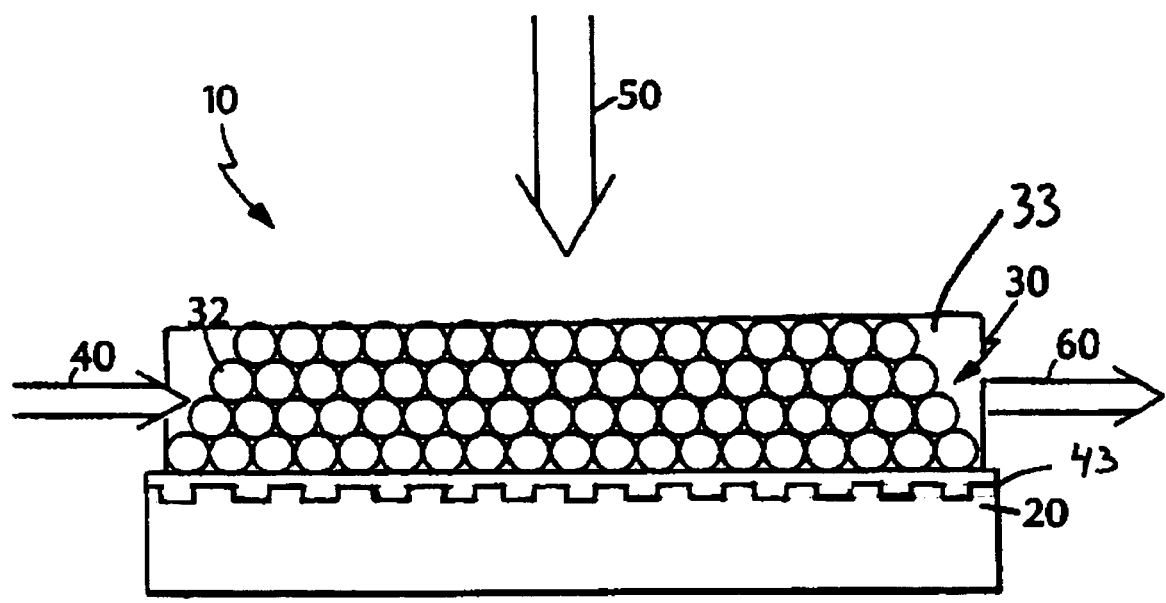
FIG. 1 is a schematic diagram of a structure of a nanocrystal and a grating.

Fabrication of a surface-emitting distributed feedback grating (DFB) laser structure allows for creation of color-selective DFB lasers. The unique optical properties of the DFB lasers can be exploited to emit in the range of wavelengths for 560 nm to 625 nm by varying the size of the nanocrystals stabilized within the nanocrystal/titania matrix. A reduction of the emission line width (FWHM) from ~30 nm to ~1 nm is seen in all cases. The observed lasing spectra correspond well with the measured gain spectra of all these films and is always spectrally red-shifted with respect to the linear PL emission profile. Under our detection conditions, the laser line widths for all the nanocrystal laser devices (FWHM approx. 1-1.5 nm) show a time-integrated envelope of many lateral competing DFB lasing modes. Finally, instead of varying the underlying grating periodicity, the effective refractive index of the nanocrystal/titania matrix can be varied by modulating the volume fraction of the constituent nanocrystals. The ability to independently vary both the refractive index as well as the spectral gain position of such systems can allow us to create more complicated nanocrystal lasers operating simultaneously at multiple wavelengths.

Amplifiers and lasers include gain media for amplifying radiation or producing radiation by lasing. The gain medium can include a plurality of semiconductor nanocrystals. The nanocrystals can be illuminated with a light source at an absorption wavelength to cause an emission at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris (trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

The composite can be substantially free of defects such that the films provide gain to optical radiation when excited by a source. Nanocrystal solids containing defects, i.e., those films not substantially free of defects, generate losses, e.g., scatter, such that the films do not generate amplified stimulated emission when excited with a source. The thickness of the film can be, generally, between about 0.2 microns to 10 microns, or about 0.25 microns to 6 microns.

Composite of nanocrystals can be formed by redispersing the powder semiconductor nanocrystals described above in a solvent system and drop casting films of the nanocrystals from the dispersion. The solvent system for drop casting depends on the chemical character of the outer surface of the nanocrystal, i.e., whether or not the nanocrystal is readily dispersible in the solvent system. For example, a tetrahydrofuran/ethanol solvent system can be used to drop cast films of nanocrystals having a surface modified with tris-hydroxylpropylphospine (tHPP) ligand. Nanocrystals having a pyridine surface can be drop cast from a 9:1 methanol/pyridine solvent system. The drop cast films are dried in an inert atmosphere for about 12 to 24 hours before being dried under vacuum. Typically, the films are formed on substrates. The substrate can be made from any material that does not react with the nanocrystals. The substrate can be selected such that it is opaque or transparent at specific energies of optical radiation. The substrate can be formed in a variety of shapes. Examples of substrate materials include sapphire and silicon. Prior to receiving the film, a substrate can be cleaned by oxygen plasma to remove surface organic contaminants. Alternatively, the hydrophilicity of the substrate's surface can be increased by first treating the susbstrate with an etch solution of 7:3 ratio of concentrated sulfuric acid and hydrogen peroxide followed by treatment with 1:1:7 solution of concentrated ammonium hydroxide, hydrogen peroxide and water, to increase the Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum. Solid nanocrystal thicknesses can be determined using an ultraviolet/visible spectrometer by measuring the optical absorption of the nanocrystal solid and applying Beer's law.

Pump-probe laser experiments, such as transient absorption femtosecond laser experiments, can be used to determine the optical gain of concentrated solids of semiconductor nanocrystals. Concentrated solids of semiconducting nanocrystals, such as close-packed solids, can exhibit gain of optical radiation of about $10 \text{ cm}^{-1}$, $25 \text{ cm}^{-1}$, $50 \text{ cm}^{-1}$, $100 \text{ cm}^{-1}$, or $1,000 \text{ cm}^{-1}$. The onset of gain in films of semiconductor nanocrystals occurs when a source excites the nanocrystals to produce electron-hole (e-h) pairs in the semiconductor nanocrystal. Gain can be observed in concentrated solids of semiconductor nanocrystals at a range of temperatures (between about 6K to 310K, or above) when the excitation source produces more than about 1.0, 1.5, or 2.0 e-h pairs per semiconductor nanocrystal. Increasing the source power density to increase the number e-h pairs can increase the gain of the film. Although described as optical, the excitation source can electrical. In general, the excitation source should be capable of generating a population inversion of the nanocrystal solid.

Gain in the concentrated solids occurs at energies equal to or lower than the band gap photoluminescence, i.e., emission. For example, the maximum gain can occur at an energy at or below the maximum band gap emission. The energy of the band gap emission, as described above, depends on the semiconductor material and the size of the quantum-confined nanocrystallite. The energy difference between the maximum of the gain and the emission maximum decreases with decreasing size of the nanocrystal.

The composite of semiconductor nanocrystals can include nanocrystallites of the same size and the same semiconductor materials to produce gain in a narrow band of radiation energies, such as in a band of energies having a FWHM less than about 75 nm. Alternatively, the semiconductor films can be made of different materials, the same material but with different sizes, or both, to produce gain in a broad band of radiation energies or in multiple narrow bands centered at different radiation energies.

Referring to FIG. 1, a surface-emitting distributed feedback grating laser 10 includes a substrate 20, a gain medium 30 and grating 43. Gain medium 30 includes a composite of nanocrystals 32 in a metal oxide matrix 33. In operation, a user of amplifier 10 directs an input optical radiation beam 40 through gain medium 30 and provides an external optical radiation beam 50 to excite the gain medium to create a population inversion. Provided that the energy of input optical beam 40 overlaps the energies at which gain medium 30 facilitates gain, amplifier 10 amplifies optical beam 40 to produce an amplified output beam 60.

The general methodology for preparing the structures is based on the following example. First, both CdSe and CdSe (ZnS) core-shell nanocrystals are synthesized using procedures previously described (see, C. B. Murray et al., *J. Amer. Chem. Soc.* 1993, 115, 8706, C. B. Murray, et al., *J. Am. Chem. Soc.* 1993, 115, 8706, B. O. Dabbousi et al., *J. Phys.*

Chem. B 1997, 101, 9463). The native trioctylphosphine/ trioctylphosphine oxide (TOP/TOPO) ligands surrounding the as-synthesized nanocrystals are replaced with a tris-hydroxylpropylphospine (tHPP) ligand, which makes the nanocrystals stable in alcoholic solvents and provides a tether with which the nanocrystals can be incorporated into a titania matrix. Repeated centrifuging/redispersion steps remove the excess TOPO cap. Purified nanocrystals are then transferred into an inert atmosphere glove box, where they are dispersed in a 1:5 (w/w) solution of tetrahydrofuran and ethanol. To the resulting slurry an equal mass of the new ligand, tHPP, is added. Under constant stirring, a stoichiometric equivalent volume (to tHPP) of titanium (IV) butoxide (tBOT) is added. The resulting solution is allowed to prepolymerize at 60° C. for two hours in the glove box, at the completion of which a clear homogenous solution results. Spin coating of this solution on pre-cleaned silica substrates under controlled humidity conditions (~20%), and subsequent annealing at 200° C. on a hotplate for two minutes, yields a clear, nanocrystal/titania composite film. The relative ratio of nanocrystal/tHPP to tBOT determines the refractive index of the film, which is sensitively dependent on the volume fraction of nanocrystals. The thickness of the film is coarsely controlled by the ratio of tHPP-tBOT and THF/ethanol and finely controlled by the spin rate of the spin coater. In this sense, nanocrystals are used both as a passive component of the waveguide to tune its refractive index and as the active lasing medium.

Using this procedure, films with a thickness tunable between 0.2 and 0.7 micrometers, with refractive indices between 1.65 and 1.82, and nanocrystal volume fractions as high as 12%, are reproducibly obtained. Film thickness and refractive index were determined by using a combination of profilometry, transmission spectroscopy and ellipsometry. This chemical approach is highly reproducible and easily transferable to a variety of substrates and more complex geometries.

Optical investigations of the films were as follows: The films were mounted in a cryostat and cooled to 80K, or simply kept at room temperature. The excitation laser (400 nm, 1 kHz, ~100 fs) was focused perpendicular to the substrate near an edge using a cylindrical lens. The width of the stripe on the substrate was 50-100 µm. The photoluminescence (PL) intensity from the edge of the substrate was measured as a function of the length of the excitation stripe under constant photon flux density. A narrow ASE peak was observed emerging as a function of stripe length, with a well-defined threshold, for all the samples investigated in the spectral range from 560-630 nm. The line-narrowed emission was observed at the low energy side of the spontaneous PL peak for all samples.

Figure 2:
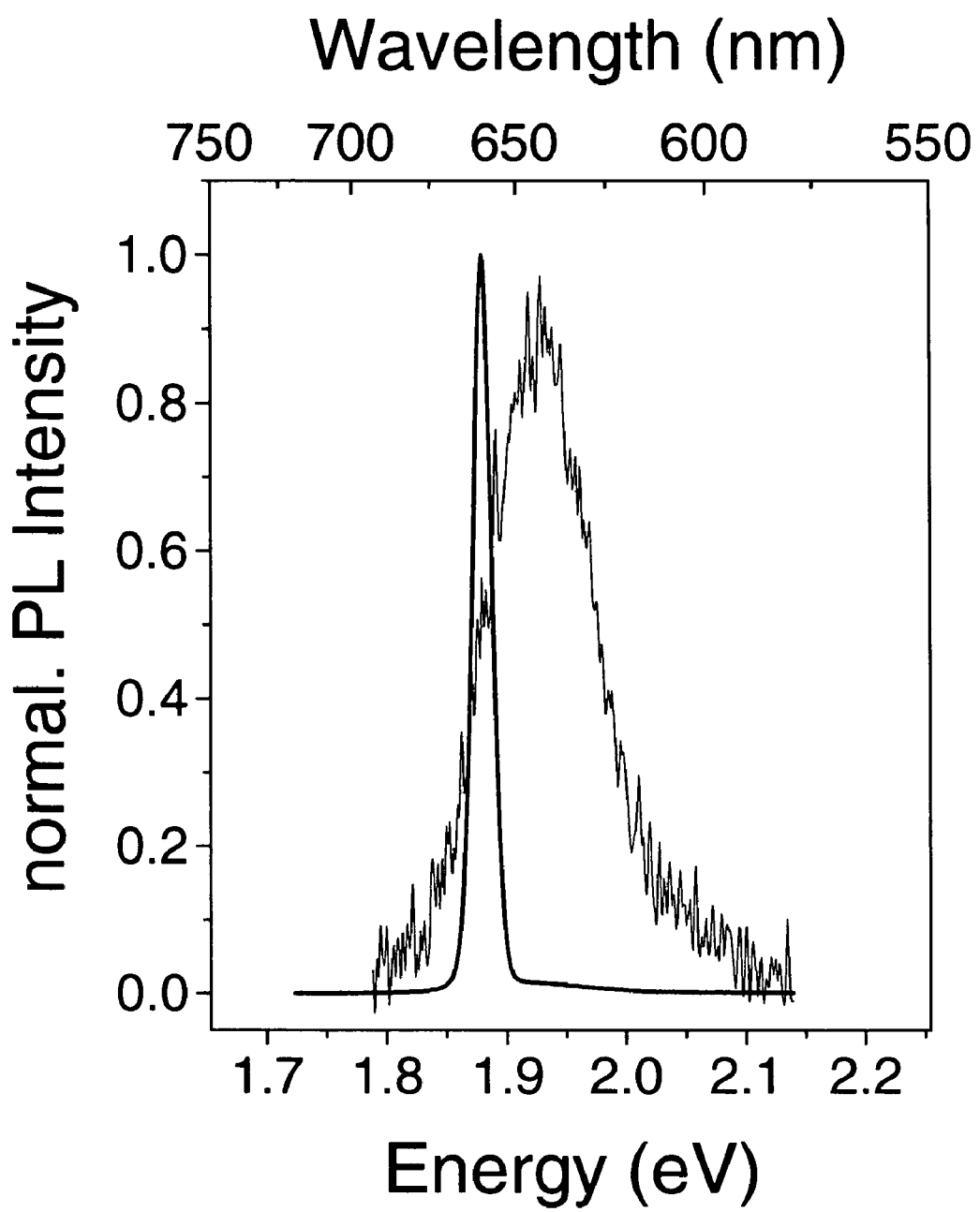
FIG. 2 shows the modal gain profile for a CdSe nanocrystal/titania waveguide.

FIG. 2 shows narrow modal gain profiles for nanocrystal/titania waveguides tunable with the nanocrystal size covering an energy range from 1.94-2.23 eV. In FIG. 2, normalized nanocrystal/titania waveguide fluorescence is depicted. A gain-induced narrowing of the spontaneous emission FWHM linewidth (from 28 nm to 7 nm) is observed above threshold. In all samples these narrow gain profiles have peak values that range from ~18 $cm^{-1}$ to ~50 $cm^{-1}$ and a FWHM of ~9-11 nm, using nanocrystals with a size-distribution <8%. This demonstrates narrow gain profiles using colloidal semiconductor nanocrystals highlighting the theoretically predicted quantum confinement effect on these materials. The width of the modal gain profile is predominantly a function of the size-distribution of the nanocrystals being used.

In general, a surface-emitting DFB laser can be prepared using the following approach. The ability to tune the refractive index of the nanocrystal/titania films then becomes critical in matching the narrow gain profiles (9 nm) to a feedback structure. A second order DFB grating was used, where optical feedback is provided through second-order Bragg scattering within the thin film, and output coupling of the generated laser light is mediated through first-order diffraction normal to the substrate. The gratings used were patterned using interference lithography. See M. L. Schattenburg, et al., *J. Vac. Sci. Technol. B*, 1995, 13, 3007, and M. Farhoud, et al., *J. Vac. Sci. Technol. B* 1999, 17, 3182, each of which is incorporated in its entirety. The use of interference lithography provides structures with excellent spatial-phase coherence over large areas, and also allows for the periodicity of the DFB structure to be easily varied. The grating periodicities can be in the range of 200 nm to 500 nm. Grating periodicities ranging from 310 nm to 350 nm were fabricated. The substrates used were standard 10-cm diameter silicon wafers, with 1 micron of thermal $SiO_2$ on their surface. The grating pattern was transferred from a photoresist into the oxide layer using a series of reactive-ion-etch (RIE) steps. The grating pattern is defined by the Bragg condition which is $2\Lambda = M(\lambda_0/n_{eff})$, where M is the order of diffraction, $\Lambda$ is the periodicity of the grating, $\lambda_0$ is the free-space wavelength of the diffracted light, and $n_{eff}$ is the effective refractive index of the active layer. After RIE, the photoresist was removed leaving gratings with a rectangular profile 50-nm deep in the $SiO_2$ layer.

Figure 3:
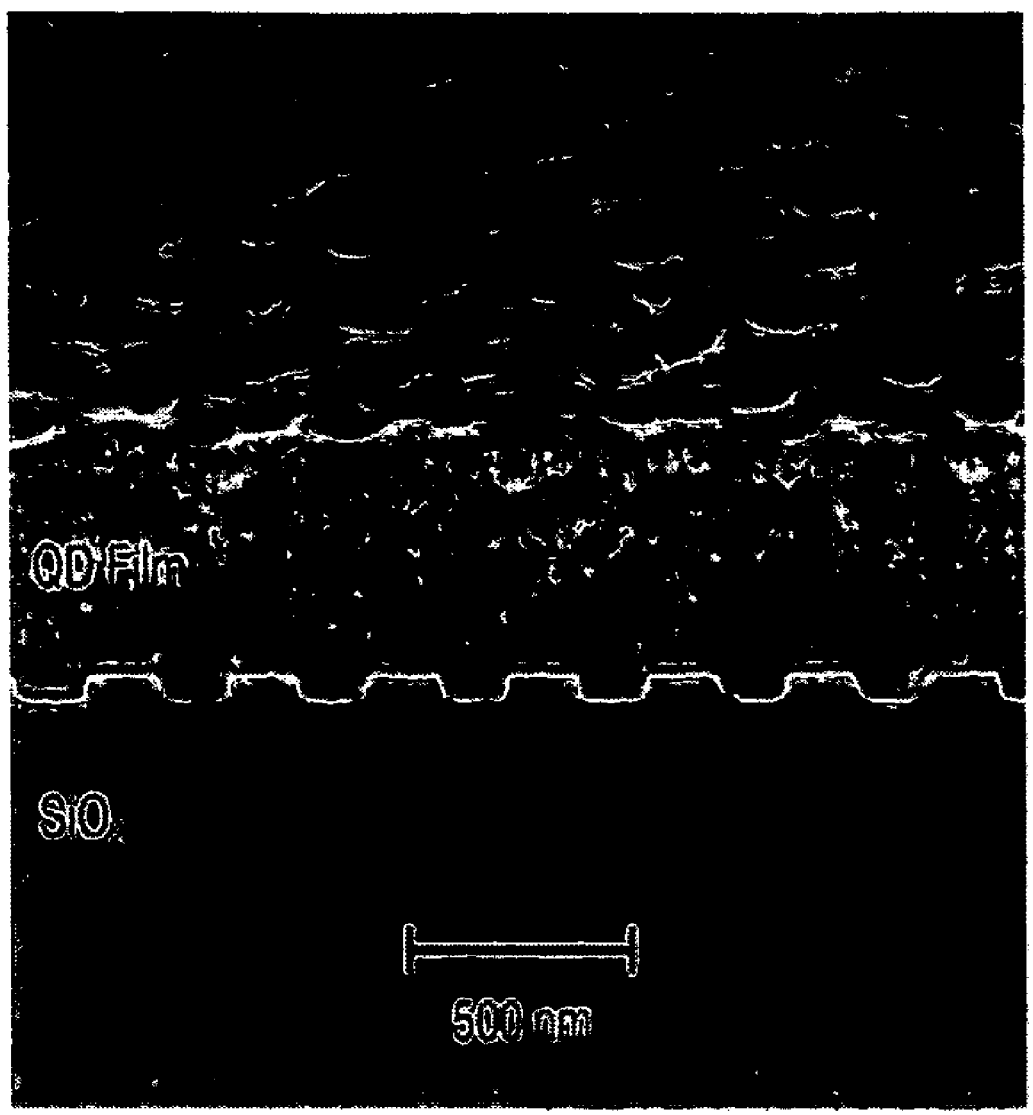
FIG. 3 is a photograph of a structure including a nanocrystal and a grating.

FIG. 3 shows a Scanning Electron Microscope (SEM) micrograph of thin films after processing on top of a DFB grating ($\Lambda$=330 nm) at 500 nm magnification. Uniform thickness is evident, though some ripples (probably caused by rapid solvent evaporation) are also seen. More specifically, FIG. 3 is a room temperature laser spectrum of a CdSe(ZnS) core-shell (2.5 nm radius CdSe core, ~2 monolayer ZnS shell) nanocrystal/titania DFB device with a period $\Lambda$=350 nm which shows a narrow peak at 626.7 nm with a FWHM=0.8 nm. FIG. 3 illustrates long-range uniformity of the nanocrystal/titania film. Absence of cracks and pinhole defects through the film are apparent on a sub-20 micrometer range; characteristics that are a marked improvement over the close-packed films. The uniformity of the thickness and surface roughness of these films is ~10 nm (rms) and is consistent with atomic force microscopy investigations on these films. Such characteristics reduce scattering losses within films and enable us to observe lasing action at room temperature.

Fabrication of a surface-emitting DFB laser structure then proceeded by spin-coating a nanocrystal/titania thin film on top of the grating. Changing the spinning speed controlled the thickness of the film. The volume fraction of nanocrystals, and thus the refractive index of the film, was adjusted to match the Bragg condition of the grating with the gain peak of the nanocrystal/titania film. The samples were mounted on the cold finger of a liquid nitrogen cryostat and cooled to 80 K. The 400 nm pulsed excitation light was focused with a cylindrical lens on the front face of the structure. Photoluminescence emission from the front of the structure was coupled into a spectrometer and spectrally analyzed with a CCD camera.

Figure 4:
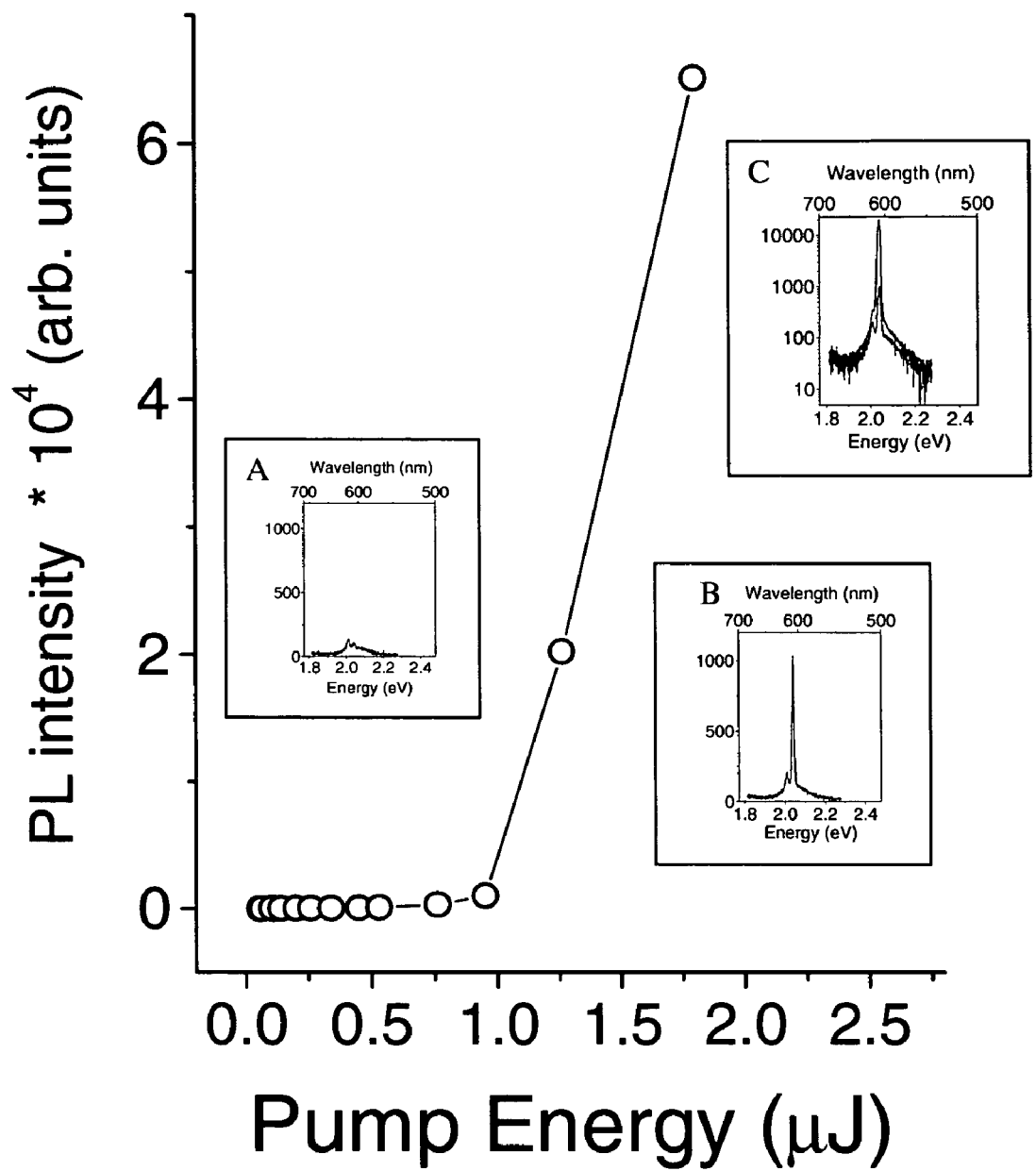
FIG. 4 is a plot of the photoluminescence intensity of a CdSe nanocrystal/titania film deposited on a DFB grating as a function of excitation pump pulse intensity.

The photoluminescence emission spectra were characterized. FIG. 4 shows the photoluminescence emission peak as a function of excitation. The insets in FIG. 4 display the spectrally dispersed, time-integrated emission at different pump powers. More specifically, FIG. 4 is a plot of the photoluminescence intensity ($\lambda$=607 nm) of a CdSe nanocrystal/titania film deposited on a DFB grating ($\Lambda$=350 nm) as a function of excitation pump pulse intensity, shows a clear lasing threshold. Inset A of FIG. 4 shows the spontaneous emission of the nanocrystal/titania film modulated by the DFB stop band. Inset B of FIG. 4 displays the spectrum of nanocrystal laser emission slightly above threshold. Inset C of FIG. 4 depicts the spectrum of nanocrystal laser emission further above threshold on a semi-log plot, overlaid with the spectrum from inset B of FIG. 4 for comparison.

In the spontaneous emission regime (inset A of FIG. 4), nanocrystal PL is convoluted with a stop band associated with the one-dimensional modulation of the refractive index of the dielectric material. This refractive index modulation results from the thickness modulation of the nanocrystal/titania film caused by the underlying grating. The stop-band gap is on the order of 10 nm and clearly shows the challenge of matching the narrow gain profile of these nanocrystal/titania structures with the grating parameters. Above the lasing threshold, modes at the edge of the stop band with the highest net gain grow super-linearly as the pump power is increased (inset B of FIG. 4 and inset C of FIG. 4). The emission from the front of the structure collapses into a visible laser beam and the luminescence spot on the film tightens into a bright narrow line.

Figure 5:
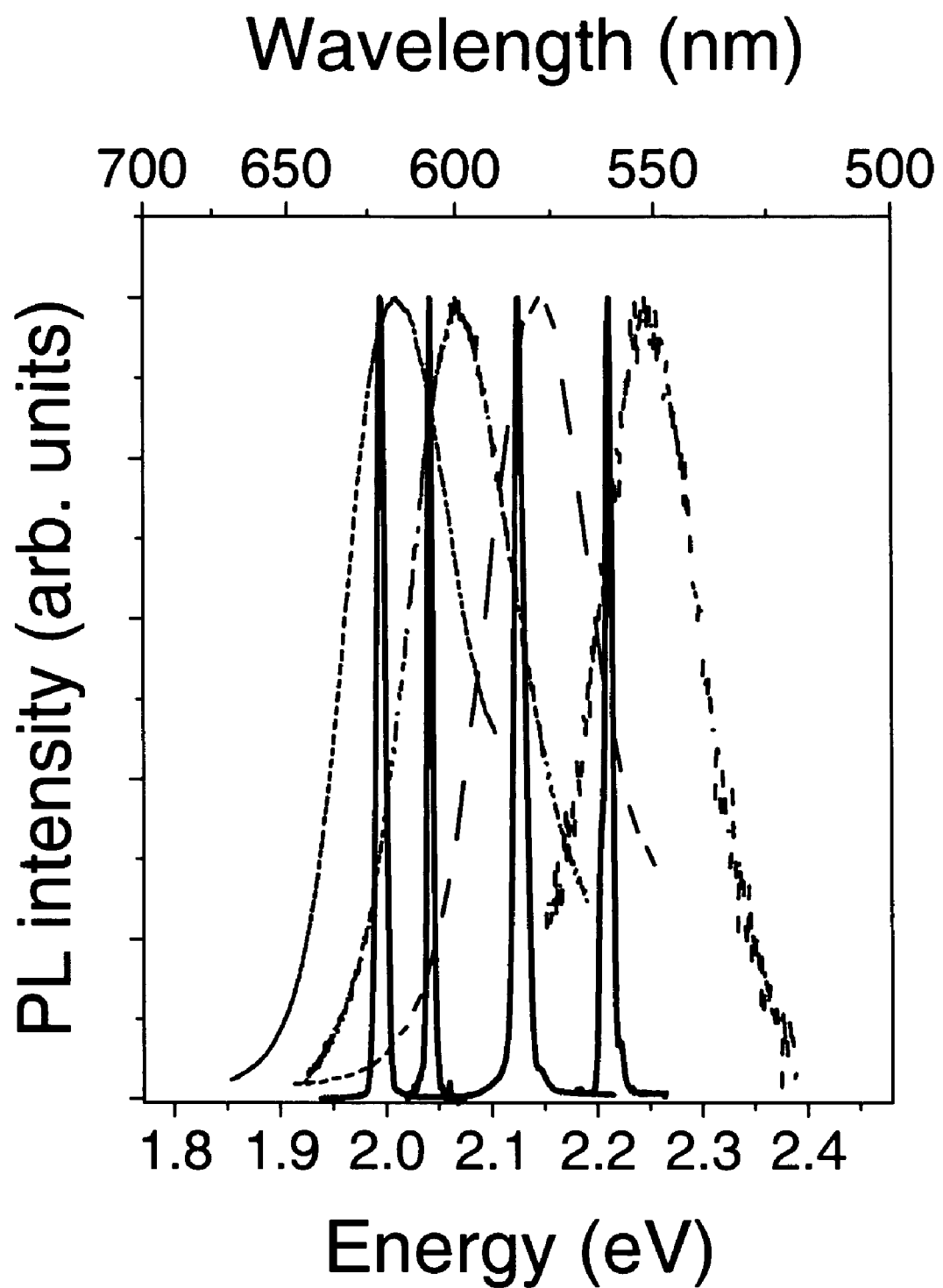
FIG. 5 is a plot of the photoluminescence emission spectra of CdSe nanocrystals with different radii.

FIG. 5 demonstrates one advantage of structures including chemically synthesized nanocrystals. The size-dependent emission spectrum of strongly quantum-confined nanocrystals is exploited to produce DFB lasers that emit in a range of wavelengths from 560 nm to 625 nm by varying the size of the nanocrystals stabilized within the nanocrystal/titania matrix. FIG. 5 is a plot of the photoluminescence emission spectra of CdSe nanocrystals with different radii (dashed lines) ((A) 2.7 nm, (B) 2.4 nm, (C) 2.1 nm (D) 1.7 nm (core CdSe)) below threshold compared to the spectra above laser threshold (solid lines) for nanocrystal/titania film DFB laser devices at 80 K. The laser emission occurs at A) 621 nm, B) 607 nm, C) 583 nm and D) 560 nm. FIG. 5 shows the normalized emission spectra at 80 K, slightly above and below threshold, of different nanocrystal/titania matrices when coupled to DFB gratings. A dramatic reduction of the emission line width (FWHM) from ~30 nm to ~1 nm is seen in all cases. The observed lasing spectra correspond well with the measured gain spectra of all these films and is always spectrally red-shifted with respect to the linear PL emission profile. All samples are CdSe nanocrystals, except for d) which are CdSe (ZnS) core-shell nanocrystals with ~2 monolayer of ZnS. Under our detection conditions, the laser line widths for all the nanocrystal laser devices (FWHM approx. 1-1.5 nm) show a time-integrated envelope of many lateral competing DFB lasing modes.

An additional benefit of using nanocrystal/titania matrices is also demonstrated in FIG. 5. The DFB lasers operating at 583, 607 and 625 nm were prepared using nanocrystals of different sizes, but with the same grating periodicity ($\Lambda$=350 nm) feedback structure. Instead of varying the underlying periodicity, the effective refractive index of the nanocrystal/titania matrix was varied by modulating the volume fraction of the constituent nanocrystals. The ability to independently vary both the refractive index as well as the spectral gain position of such systems portend well in developing nanocrystal lasers, operating simultaneously at multiple wavelengths.

Figure 6:
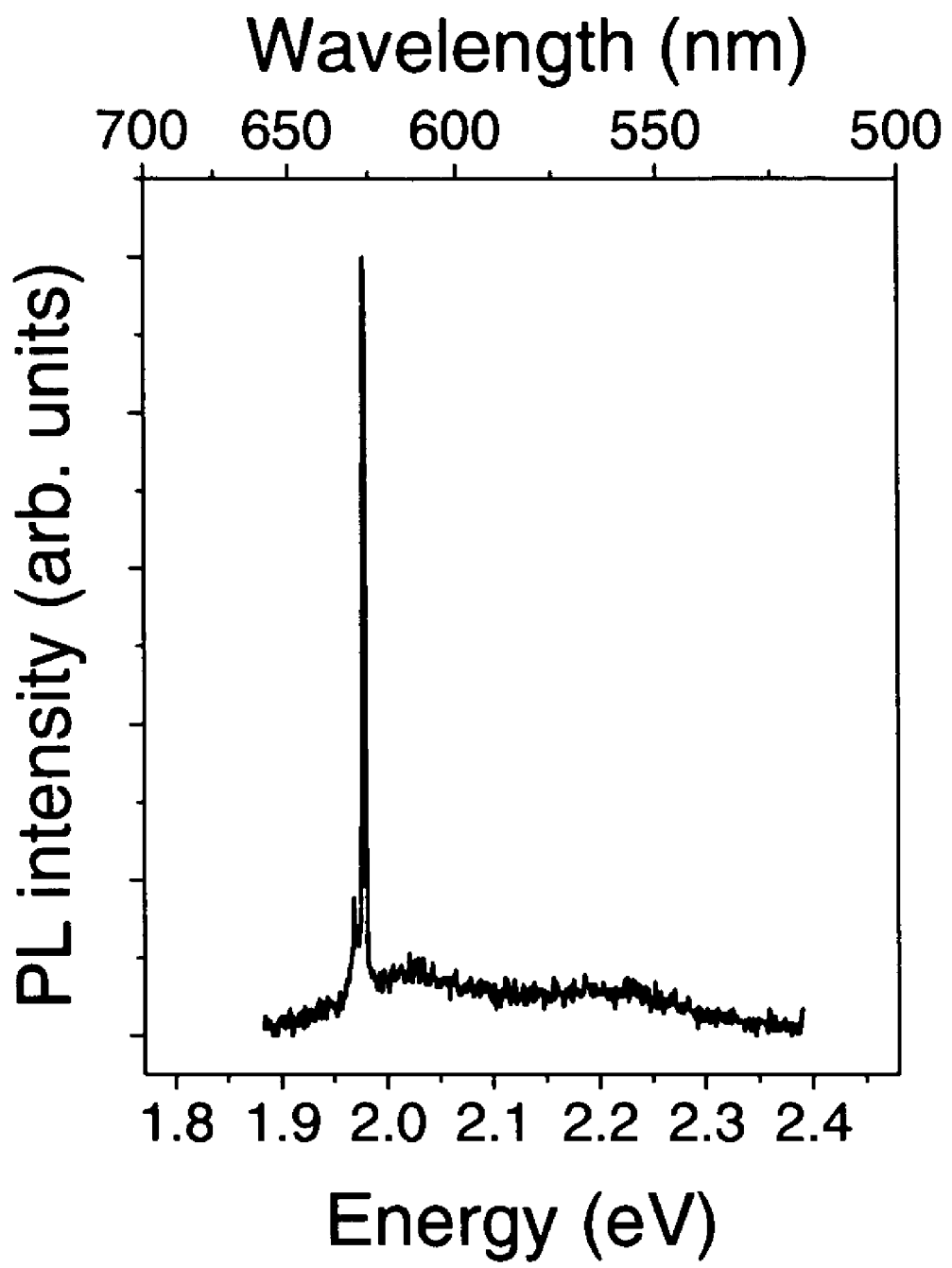
FIG. 6 is a room temperature laser spectrum of a CdSe (ZnS) core-shell nanocrystal/titania DFB device.

FIG. 6 demonstrates a room temperature nanocrystal DFB laser. The theoretically predicted temperature insensitivity of nanocrystal lasers in the strong confinement regime is observed. FIG. 6 shows the above-threshold emission profile of a nanocrystal/titania matrix coupled to a DFB grating ($\Lambda$=350 nm). A resolution-limited line width (0.8 nm) is observed from this structure at room temperature; a line width that does not vary when cooled down to 80 K.

Laser action has been demonstrated using colloidal CdSe and CdSe(ZnS) core-shell nanocrystals at room temperature as well as at 80 K. By developing a straightforward chemical route to embed nanocrystals in a titania host matrix, we are able to tune thin film properties to accurately match their narrow modal gain profiles to a surface-emitting, second-order DFB structure. The precise tunability of these new nanocrystal based lasers is demonstrated by taking advantage of the strong quantum confinement effect using different sizes and volume fractions of high quality, colloidal CdSe nanocrystals. This nanocrystal thin film system portends well for the incorporation of nanocrystals of other materials in laser applications, thus opening the possibility of UV- and IR-operating wet-chemically-prepared nanocrystal lasers. The ease, high throughput, tunability and room temperature operability of these nanocrystal systems are featured. The chemical flexibility should allow transfer of this technology to a variety of substrates and feedback schemes.

Other embodiments are within the scope of the following claims.

What is claimed is:

1. A laser comprising:
   a grating; and
   a semiconductor nanocrystal layer disposed on the grating, the layer including a plurality of semiconductor nanocrystals including a Group II-VI compound, the nanocrystals being distributed in a metal oxide matrix.

2. The laser of claim 1, wherein the layer includes greater than 5% by volume of semiconductor nanocrystals.

3. The laser of claim 1, wherein the semiconductor nanocrystal is overcoated with a second semiconductor material.

4. The laser of claim 1, wherein the plurality of nanocrystals have a monodisperse distribution of sizes.

5. The structure of claim 1, wherein the grating has a periodicity from 200 nm to 500 nm.

6. The structure of claim 1, wherein the grating has a periodicity from 300 nm to 400 nm.

* * * * *

UNITED STATES PATENT AND TRADEMARK OFFICE
CERTIFICATE OF CORRECTION

PATENT NO. : 7,470,473 B2  Page 1 of 1
APPLICATION NO. : 11/594732
DATED : December 30, 2008
INVENTOR(S) : Eisler et al.

It is certified that error appears in the above-identified patent and that said Letters Patent is hereby corrected as shown below:

Col. 1, line 9 under FEDERALLY SPONSORED RESEARCH OR DEVELOPMENT, insert -- This invention was made with Government support under Grant Nos. CHE9708265 and DMR9808941, awarded by the NSF and under Grant No. W-7405-ENG-36, awarded by DOE.
The government has certain rights to this invention. --

Signed and Sealed this

Seventeenth Day of August, 2010

David J. Kappos
*Director of the United States Patent and Trademark Office*